(12) United States Patent
Kitahara (10) Patent No.: US 12,418,987 B2
(45) Date of Patent: Sep. 16, 2025

(54) CIRCUIT BOARD, METHOD FOR MANUFACTURING CIRCUIT BOARD, AND RESONATOR DEVICE

(71) Applicant: SEIKO EPSON CORPORATION, Tokyo (JP)

(72) Inventor: Koji Kitahara, Ina (JP)

(73) Assignee: SEIKO EPSON CORPORATION, Tokyo (JP)

( * ) Notice: Subject to any disclaimer, the term of this patent is extended or adjusted under 35 U.S.C. 154(b) by 297 days.

(21) Appl. No.: 18/178,830

(22) Filed: Mar. 6, 2023

(65) Prior Publication Data
US 2023/0292441 A1 Sep. 14, 2023

(30) Foreign Application Priority Data
Mar. 8, 2022 (JP) .................................. 2022-035025

(51) Int. Cl.
| | |
|---|---|
| *H05K 1/18* | (2006.01) |
| *H01L 21/306* | (2006.01) |
| *H01L 21/768* | (2006.01) |
| *H01L 23/48* | (2006.01) |
| *H05K 3/00* | (2006.01) |
| *H05K 3/10* | (2006.01) |
| *H01L 23/00* | (2006.01) |

(52) U.S. Cl.
CPC ....... *H05K 1/182* (2013.01); *H01L 21/30604* (2013.01); *H01L 21/76831* (2013.01); *H01L 23/481* (2013.01); *H05K 3/0017* (2013.01); *H05K 3/107* (2013.01); *H01L 24/16* (2013.01); *H01L 2224/161* (2013.01); *H01L 2924/181* (2013.01); *H05K 2201/10068* (2013.01)

(58) Field of Classification Search
CPC ...... H05K 1/182; H05K 3/0017; H05K 3/107; H05K 2201/10068; H01L 21/30604; H01L 21/76831; H01L 23/481; H01L 24/16; H01L 2224/161; H01L 2924/181
USPC .......................................................... 361/761
See application file for complete search history.

(56) References Cited

U.S. PATENT DOCUMENTS

| | | | |
|---|---|---|---|
| 2008/0136038 A1* | 6/2008 | Savastiouk | H01L 21/76898 257/E23.168 |
| 2010/0283130 A1* | 11/2010 | Nishio | H01L 21/76898 257/E21.597 |
| 2012/0252164 A1* | 10/2012 | Nakao | H01L 23/481 438/107 |

(Continued)

FOREIGN PATENT DOCUMENTS

| | | |
|---|---|---|
| JP | 2008-193180 A | 8/2008 |
| JP | 2018-113466 A | 7/2018 |

*Primary Examiner* — Binh B Tran
(74) *Attorney, Agent, or Firm* — Rankin, Hill & Clark LLP (57) ABSTRACT

A circuit board includes a semiconductor substrate having a first surface and a second surface located on an opposite side from the first surface, a through hole penetrating the first surface and the second surface, an organic insulating film disposed on the first surface and a side surface of the through hole, and a conductor disposed on an opposite side of the organic insulating film from a side surface side of the through hole. The side surface of the through hole has a first side surface coupled to the first surface and having a width decreased from the first surface toward the second surface, and a second side surface coupled to the second surface from an end portion of the first side surface on a second surface side.

10 Claims, 13 Drawing Sheets

(56) References Cited

U.S. PATENT DOCUMENTS

2017/0221817 A1   8/2017  Nomura
2018/0122699 A1*  5/2018  Hasegawa ......... H01L 21/76873

* cited by examiner

CIRCUIT BOARD, METHOD FOR MANUFACTURING CIRCUIT BOARD, AND RESONATOR DEVICE

The present application is based on, and claims priority from JP Application Serial Number 2022-035025, filed Mar. 8, 2022, the disclosure of which is hereby incorporated by reference herein in its entirety.

BACKGROUND

1. Technical Field

The present disclosure relates to a circuit board, a method for manufacturing a circuit board, and a resonator device.

2. Related Art

For example, JP-A-2018-113466 discloses a through electrode formed by providing a through hole in a silicon substrate in a semiconductor device, the through hole penetrating from one main surface to another main surface on an opposite side from the one main surface and having a substantially vertical inner wall, forming an organic insulating layer covering an insulating layer formed at the inner wall of the through hole, and forming a conductive layer in the through hole.

However, in the through electrode disclosed in JP-A-2018-113466, since the through hole is substantially vertical, when the organic insulating layer is to be uniformly formed at the inner wall of the through hole and one main surface, there is a problem that the organic insulating layer is locally thinned at a coupling portion between the inner wall of the through hole and the one main surface, and an insulating function is deteriorated.

SUMMARY

A circuit board includes: a semiconductor substrate having a first surface and a second surface located on an opposite side from the first surface; a through hole penetrating the first surface and the second surface; an organic insulating film disposed on the first surface and a side surface of the through hole; and a conductor disposed on an opposite side of the organic insulating film from a side surface side of the through hole. The side surface of the through hole has a first side surface coupled to the first surface and having a width decreased from the first surface toward the second surface, and a second side surface coupled to the second surface from an end portion of the first side surface on a second surface side.

A method for manufacturing a circuit board, the circuit board including a single crystal silicon substrate having a first surface and a second surface located on an opposite side from the first surface, a through hole penetrating the first surface and the second surface, an organic insulating film disposed on the first surface and a side surface of the through hole, and a conductor disposed on an opposite side of the organic insulating film from a side surface side of the through hole, the method for manufacturing a circuit board including: a circuit board preparation step of preparing the circuit board including the single crystal silicon substrate; a groove forming step of forming, on the first surface by wet etching, a bottomed groove having a rectangular shape in a plan view and having a first side surface having a width decreased toward the second surface; a through hole forming step of forming the through hole having a second side surface extending from an end portion of the first side surface on a second surface side toward the second surface and penetrating the first surface and the second surface; an organic insulating film forming step of forming the organic insulating film at the first surface and the first side surface and the second side surface of the through hole; and a conductor forming step of forming the conductor on the opposite side of the organic insulating film from the side surface side of the through hole.

A resonator device includes: the circuit board described above; a resonator element disposed on the first surface or the second surface of the circuit board and electrically coupled to the conductor; and a lid bonded to the circuit board so as to accommodate the resonator element between the lid and the circuit board.

DESCRIPTION OF EXEMPLARY EMBODIMENTS

1. First Embodiment

First, a resonator device 1 including a circuit board 10 according to a first embodiment will be described with reference to FIGS. 1 to 4 by taking, as an example, an oscillator in which a resonator element 3 is accommodated in an internal space S formed by a lid 2 and the circuit board 10.

Figure 1:
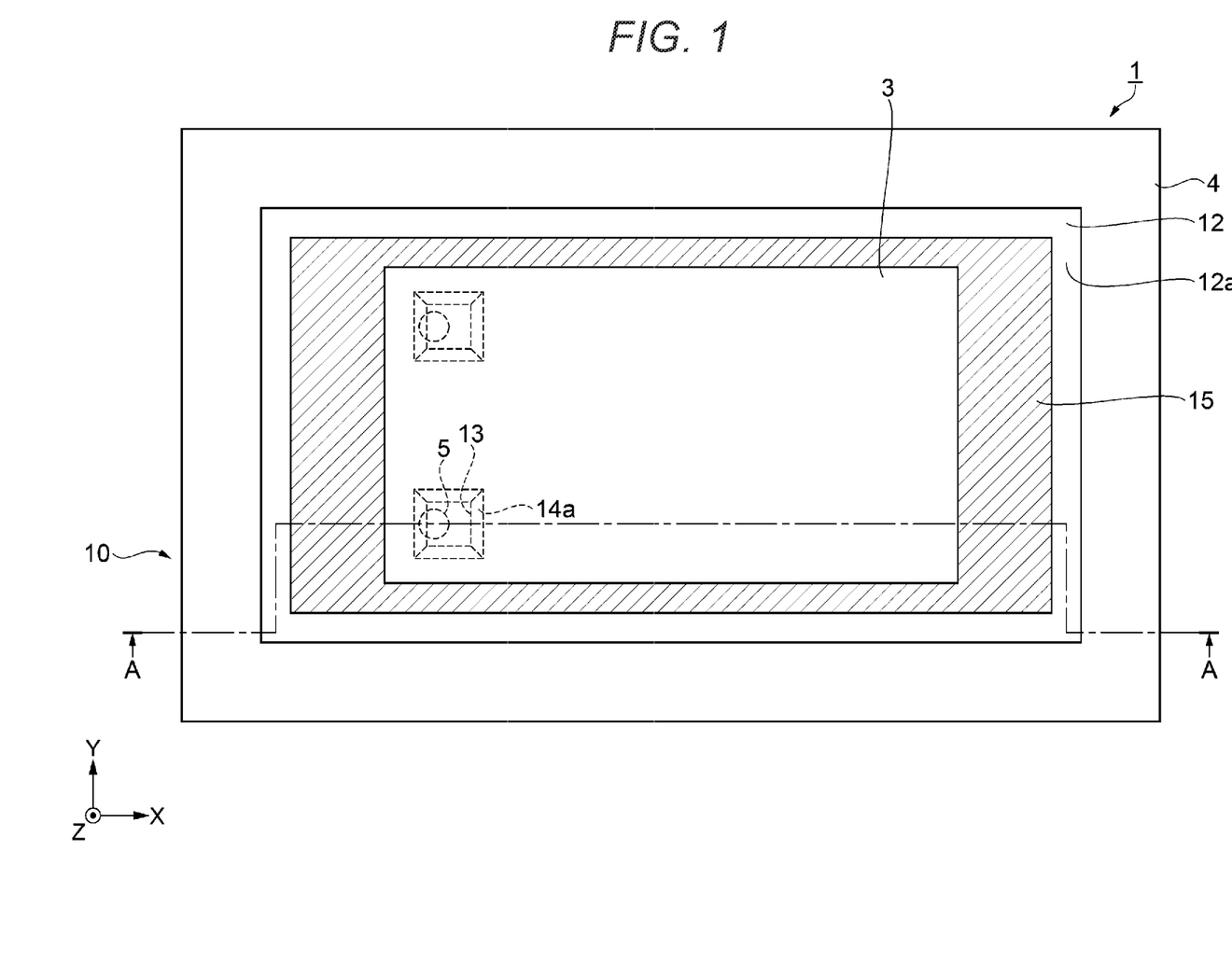
FIG. 1 is a plan view showing a resonator device including a circuit board according to a first embodiment.
Figure 2:
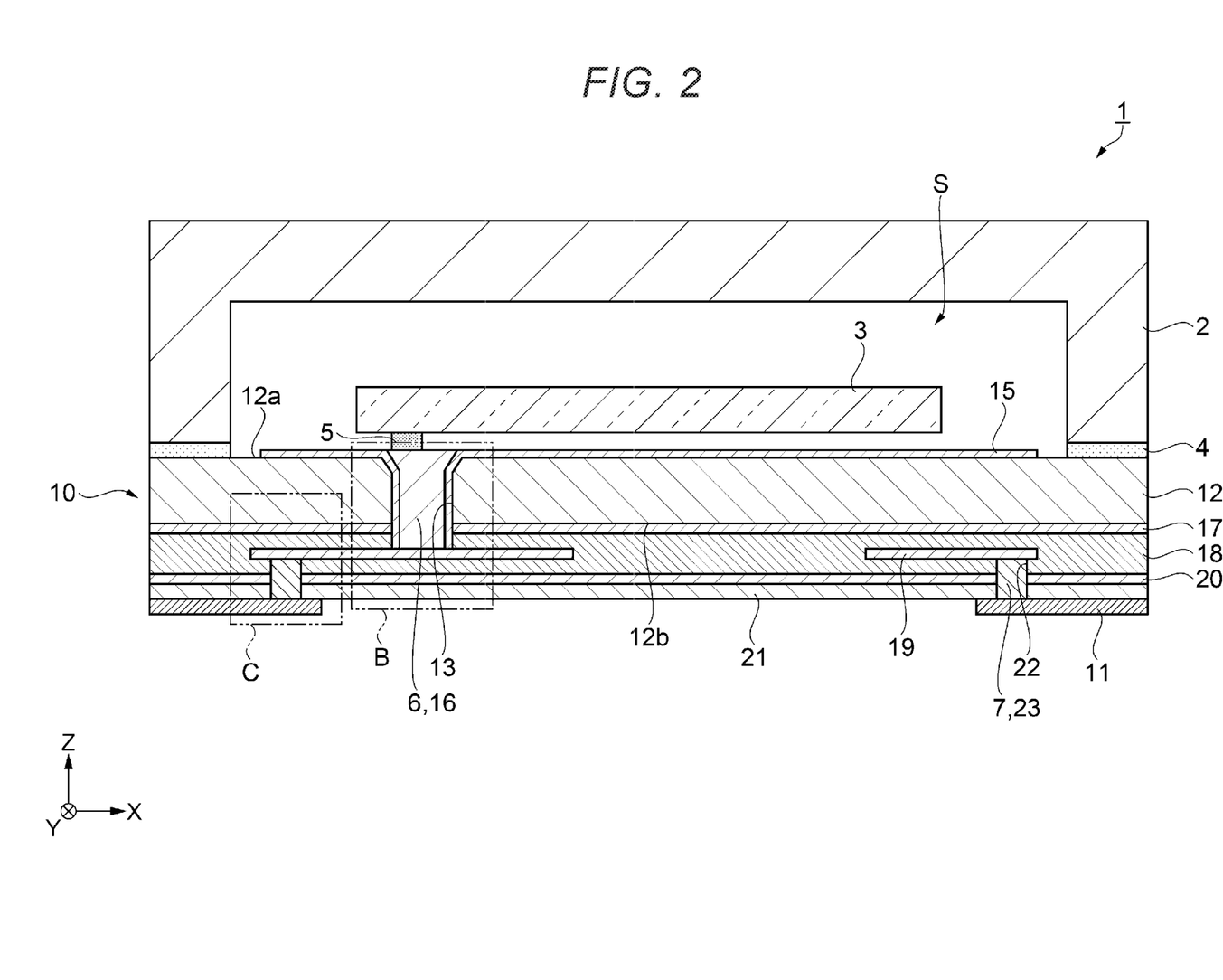
FIG. 2 is a cross-sectional view taken along a line A-A in FIG. 1.

FIG. 1 shows a state in which the lid 2 is removed for convenience of description of an internal configuration of the resonator device 1. In FIGS. 1 and 2, electrodes provided on front and back surfaces of the resonator element 3 are not shown. For convenience of the description, in the following plan views and cross-sectional views, an X axis, a Y axis, and a Z axis are shown as three axes orthogonal to one another. A direction along the X axis is referred to as an "X direction", a direction along the Y axis is referred to as a "Y direction", and a direction along the Z axis is referred to as a "Z direction". An arrow side of each axis is also referred to as a "plus side", and a side opposite to the arrow side is referred to as a "minus side". A plus side in the Z direction is also referred to as "upper", and a minus side in the Z direction is also referred to as "lower".

As shown in FIGS. 1 and 2, the resonator device 1 includes the circuit board 10, the lid 2, and the resonator element 3.

The circuit board 10 has a rectangular shape in a plan view from the Z direction, and includes a semiconductor substrate 12 having a first surface 12a and a second surface 12b located on an opposite side from the first surface 12a, a through hole 13 penetrating the first surface 12a and the second surface 12b, an organic insulating film 15 disposed on the first surface 12a and a side surface 14 of the through hole 13, and a conductor 16 disposed on an opposite side of the organic insulating film 15 from a side surface 14 side of the through hole 13. The conductor 16 provided in the through hole 13 serves as a through electrode 6. The semiconductor substrate 12 is a single crystal silicon substrate, more specifically, a single crystal silicon (100) substrate.

Further, in the circuit board 10, the organic insulating film 15 coupled to the organic insulating film 15 disposed on the side surface 14 of the through hole 13 is provided on the first surface 12a of the semiconductor substrate 12, and a SiN film 17, a SiO$_2$ film 18, a SiN film 20, a circuit 21 including an oscillation circuit, and an external terminal 11 are stacked on the second surface 12b of the semiconductor substrate 12. An Al film 19 serving as a wiring is formed in the SiO$_2$ film 18.

The conductor 16 as the through electrode 6 penetrates the SiN film 17 and the SiO$_2$ film 18 on a second surface 12b side of the semiconductor substrate 12, is electrically coupled to the Al film 19, and is electrically coupled to the circuit 21 via the Al film 19. The resonator element 3 is mechanically and electrically bonded onto the through electrode 6 via a bonding member 5 such as a gold bump. Therefore, the resonator element 3 is electrically coupled to the oscillation circuit of the circuit 21 and can oscillate.

Figure 3:
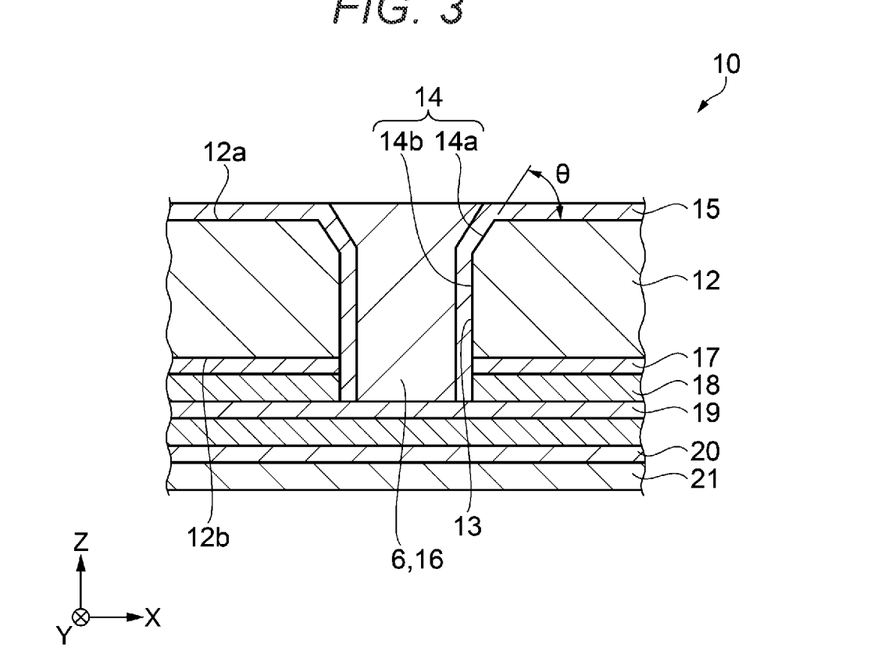
FIG. 3 is an enlarged view of a portion B in FIG. 2.

The through hole 13 in which the through electrode 6 is formed has a rectangular shape in the plan view from the Z direction, and as shown in FIG. 3, the side surface 14 of the through hole 13 has four first side surfaces 14a coupled to the first surface 12a and each having a width decreased from the first surface 12a toward the second surface 12b, and four second side surfaces 14b each coupled to the second surface 12b from an end portion of the first side surface 14a on a second surface 12b side.

An angle θ of the first side surface 14a with respect to the first surface 12a is 54.7 degrees, and the first side surface 14a is a surface of the single crystal silicon (111) substrate. The second side surface 14b is a surface perpendicular to the first surface 12a. Since the through hole 13 has the first side surfaces 14a formed between the first surface 12a and the second side surface 14b, when the organic insulating film 15 is formed on the first surface 12a and the side surface 14 of the through hole 13, it is possible to prevent the organic insulating film 15 from being locally thinned and to prevent deterioration of an insulating function.

Figure 4:
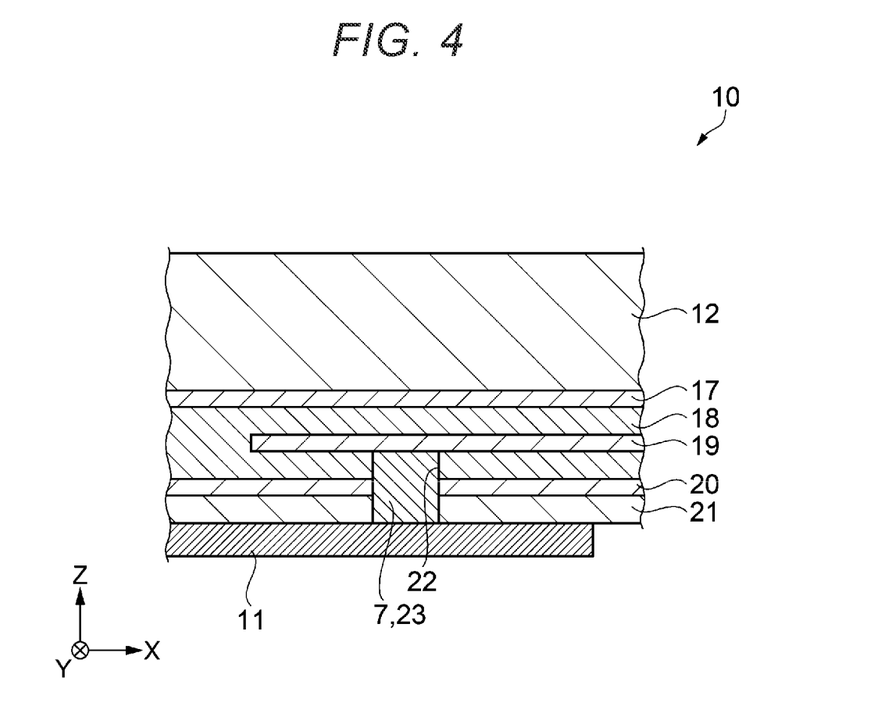
FIG. 4 is an enlarged view of a portion C in FIG. 2.

As shown in FIG. 4, the external terminal 11 is electrically coupled to the Al film 19 serving as the wiring via a through electrode 7 as a conductor 23 provided in a through hole 22 penetrating the SiO$_2$ film 18, the SiN film 20, and the circuit 21.

The lid 2 has a rectangular shape in the plan view from the Z direction, has a cavity on a surface facing the circuit board 10, and forms the internal space S for accommodating the resonator element 3 between the lid 2 and the circuit board 10. The resonator element 3 is accommodated in the internal space S and the lid 2 is bonded to the circuit board 10 via a bonding member 4. The internal space S is in a depressurized state, preferably in a state closer to vacuum. Accordingly, viscous resistance is reduced, and oscillation characteristics of the resonator element 3 are improved. The lid 2 is preferably made of the same material as the semiconductor substrate 12.

The resonator element 3 is disposed on the first surface 12a of the circuit board 10, and is mechanically and electrically coupled to a pair of conductors 16 as the through electrodes 6 via a pair of bonding members 5 such as gold bumps. The resonator element 3 according to the embodiment is an AT cut quartz crystal resonator element, but may be an SC cut quartz crystal resonator element or a BT cut quartz crystal resonator element. A constituent material of the resonator element 3 is not limited to the quartz crystal, and for example, may be a piezoelectric single crystal body such as lithium niobate, lithium tantalate, lithium tetraborate, langasite, potassium niobate, and gallium phosphate.

As described above, in the circuit board 10 according to the embodiment, since the through hole 13 has the first side surface 14a, which has the angle θ with respect to the first surface 12a less than 90 degrees, formed between the first surface 12a and the second side surface 14b, when the organic insulating film 15 is formed on the first surface 12a and the side surface 14 of the through hole 13, it is possible to prevent the organic insulating film 15 from being locally thinned and to prevent the deterioration of the insulating function. Therefore, it is possible to obtain the resonator device 1 having high insulation between the conductor 16 serving as the through electrode 6 and the semiconductor substrate 12 and excellent reliability.

Next, a method for manufacturing the circuit board 10 according to the first embodiment will be described with reference to FIGS. 5 to 13.

Figure 5:
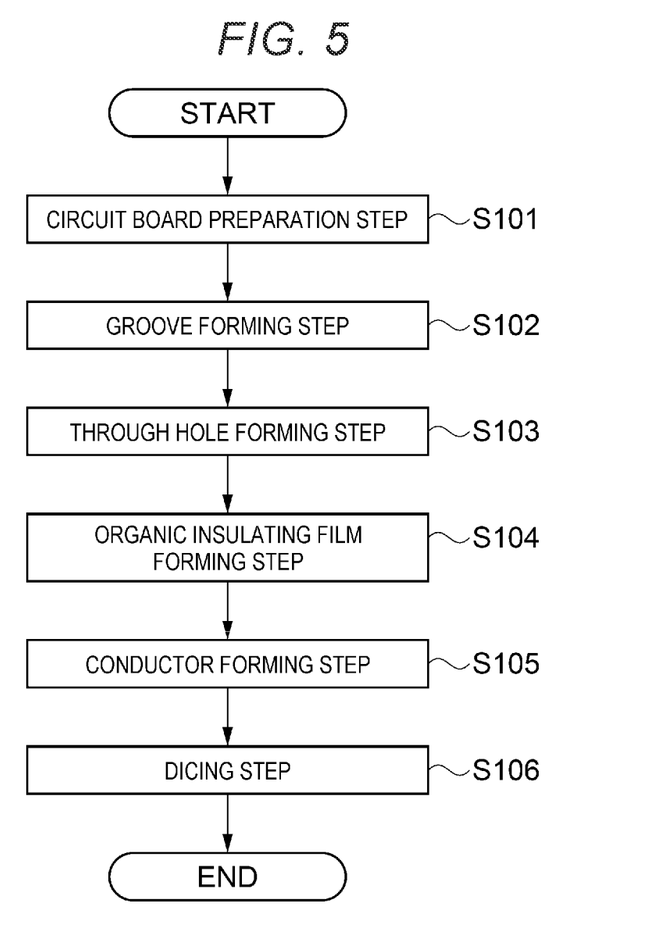
FIG. 5 is a flowchart showing a method for manufacturing the circuit board according to the first embodiment.

As shown in FIG. 5, the method of manufacturing the circuit board 10 according to the embodiment includes a circuit board preparation step, a groove forming step, a through hole forming step, an organic insulating film forming step, a conductor forming step, and a dicing step.

1.1. Circuit Board Preparation Step

First, in step S101, in order to manufacture a plurality of circuit boards 10 at the same time, the large circuit board 10 including the semiconductor substrate 12 is prepared. The semiconductor substrate 12 is the single crystal silicon substrate, more specifically, the single crystal silicon (100) substrate.

1.2 Groove Forming Step

Figure 6:
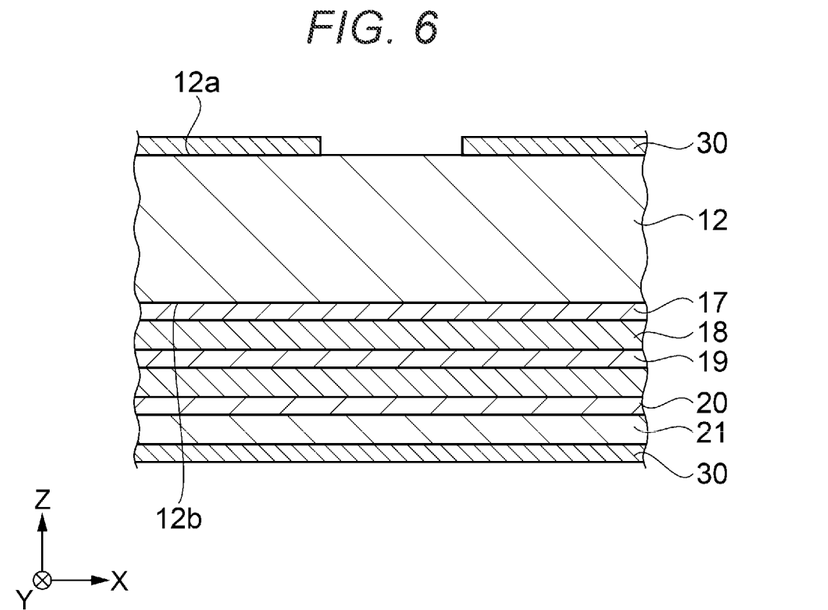
FIG. 6 is a cross sectional view showing the method for manufacturing the circuit board.
Figure 7:
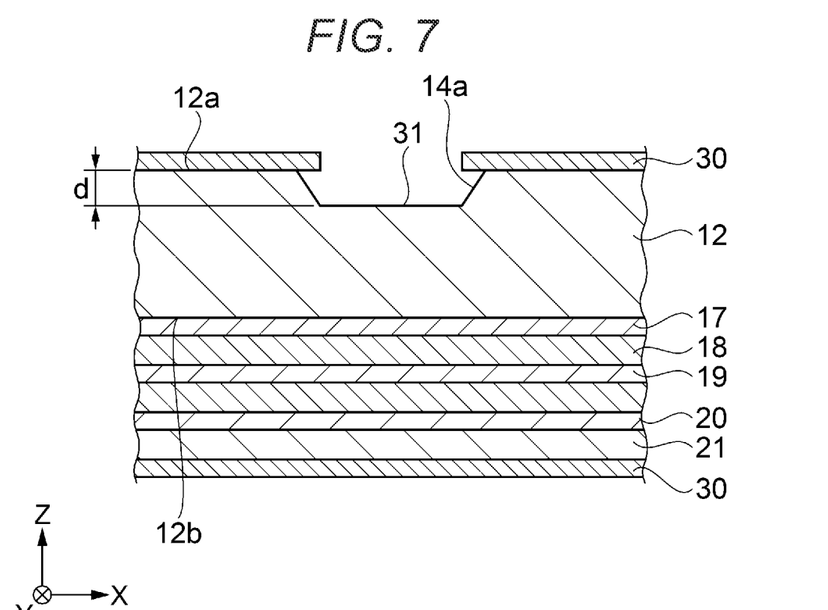
FIG. 7 is a cross sectional view showing the method for manufacturing the circuit board.

In step S102, as shown in FIG. 6, a photosensitive resin 30 such as a resist is applied onto the first surface 12a of the semiconductor substrate 12 and the circuit 21, and an opening portion is formed at a position where the through hole 13 is provided by a photolithography technique. Thereafter, as shown in FIG. 7, a bottomed groove 31 having a rectangular shape in a plan view and having the first side surfaces 14a each having a width decreased toward the second surface 12b is formed in the first surface 12a by anisotropic wet etching of silicon using an etchant such as KOH or TMAH. A depth d of the groove 31 is preferably 0.1 μm or more and 3 μm or less, and more preferably 0.2 μm or more and 2 μm or less. When the depth d is smaller than this range, an overhang portion between the silicon substrate 5 and the photosensitive resin 30 becomes small, and a catalyst film 32 made of Au or the like that is to be evaporated in a subsequent step couples a silicon substrate side and the photosensitive resin 30, and cannot be lifted off. On the other hand, when the depth d is larger than this range, a portion at an end portion of the catalyst film 32 where the film is thin is formed, resulting in isolated particles. Therefore, there is a problem that a large number of small holes are formed around the opening portion of the through hole 13 during metal assisted chemical etching (MACE) processing which is the subsequent step.

1.3. Through Hole Forming Step

Figure 8:
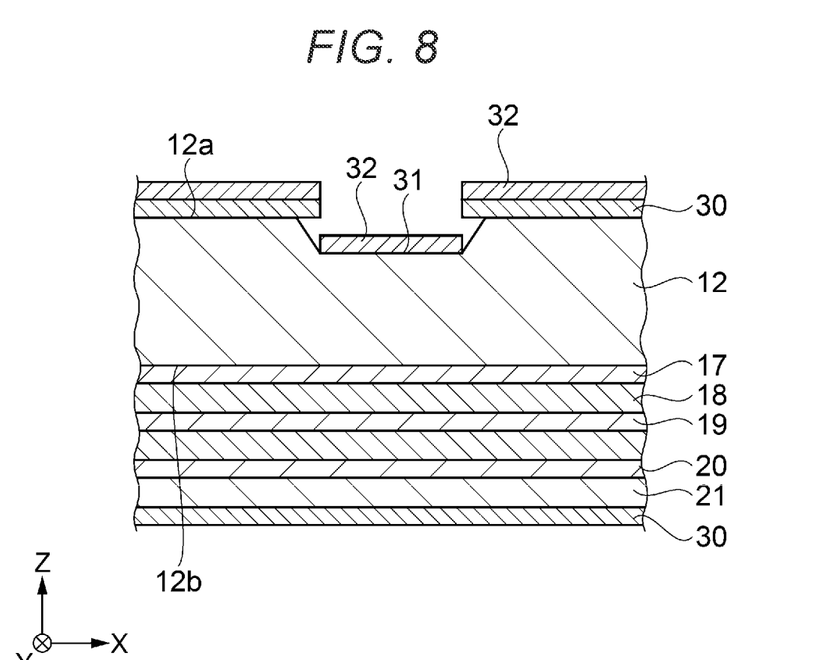
FIG. 8 is a cross sectional view showing the method for manufacturing the circuit board.
Figure 9:
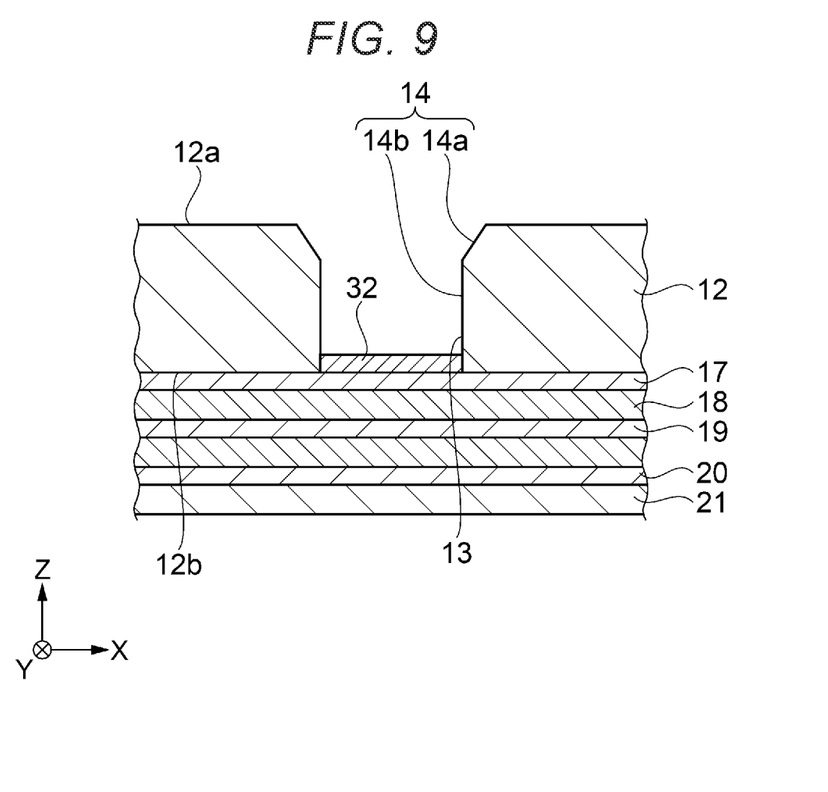
FIG. 9 is a cross sectional view showing the method for manufacturing the circuit board.
Figure 10:
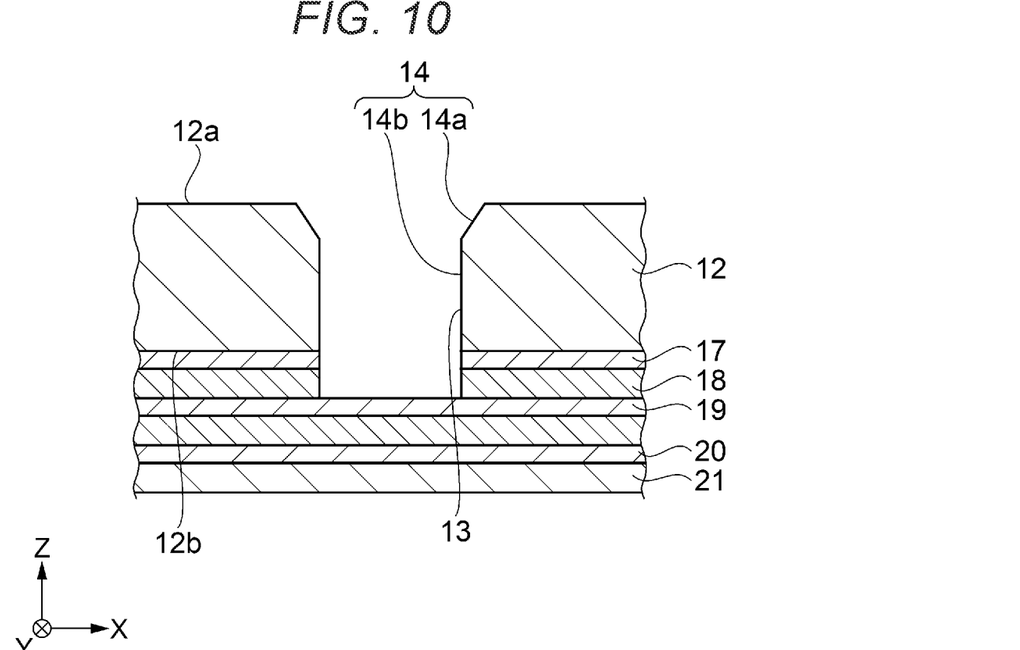
FIG. 10 is a cross sectional view showing the method for manufacturing the circuit board.

In step S103, as shown in FIG. 8, the catalyst film 32 made of Au or the like is formed on the photosensitive resin 30 and an inner bottom surface of the groove 31 by an evaporation method or a sputtering method, and the catalyst film 32 on the photosensitive resin 30 and the photosensitive resin 30 on the circuit 21 are removed by a lift-off method. Thereafter, as shown in FIG. 9, the through hole 13 having the second side surfaces 14b extending from the end portions of the first side surfaces 14a on the second surface 12b side toward the second surface 12b and penetrating the first surface 12a and the second surface 12b is formed by the MACE method. After the catalyst film 32 on the inner bottom surface of the through hole 13 is removed, the SiN film 17 and the SiO$_2$ film 18 are etched to expose the Al film 19 as an inner bottom surface of the through hole 13 as shown in FIG. 10.

1.4. Organic Insulating Film Forming Step

Figure 11:
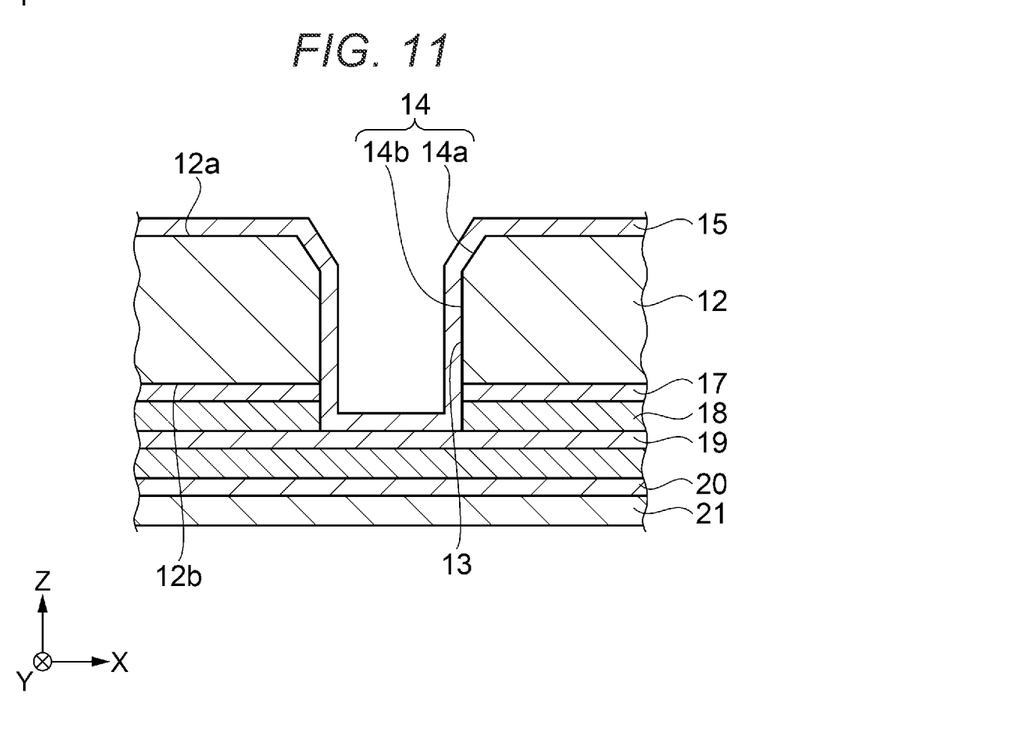
FIG. 11 is a cross sectional view showing the method for manufacturing the circuit board.
Figure 12:
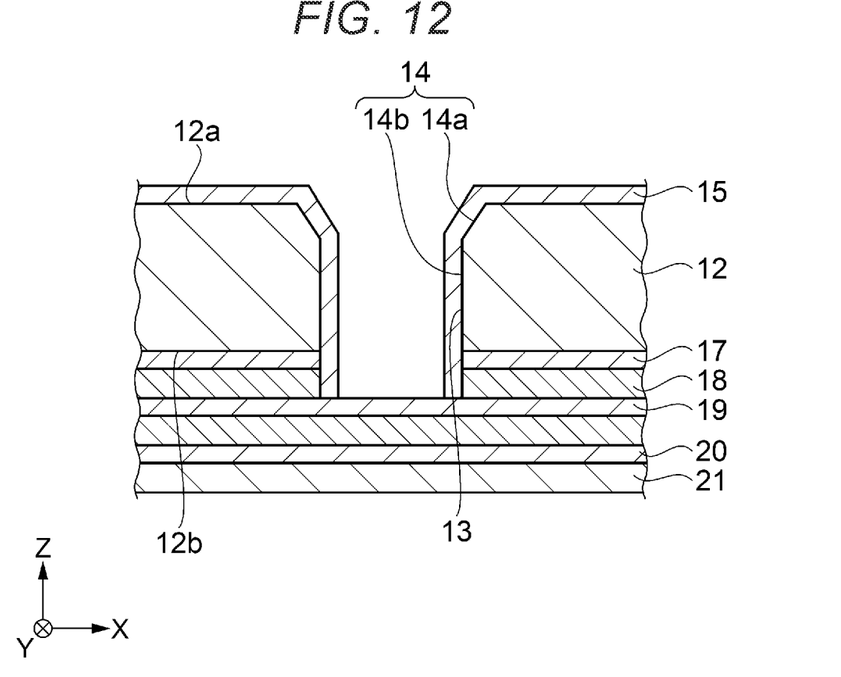
FIG. 12 is a cross sectional view showing the method for manufacturing the circuit board.

In step S104, as shown in FIG. 11, the photosensitive organic insulating film 15, which is liquid SiO$_2$, is applied to the first surface 12a, and the first side surfaces 14a and the second side surfaces 14b of the through hole 13. Thereafter, the photosensitive organic insulating film 15 applied to the inner bottom surface of the through hole 13 is removed by exposure and development, and as shown in FIG. 12, the Al film 19 is exposed as the inner bottom surface of the through hole 13. In this manner, the organic insulating film 15 is formed on the first surface 12a, and the first side surfaces 14a and the second side surfaces 14b of the through hole 13.

1.5. Conductor Forming Step

Figure 13:
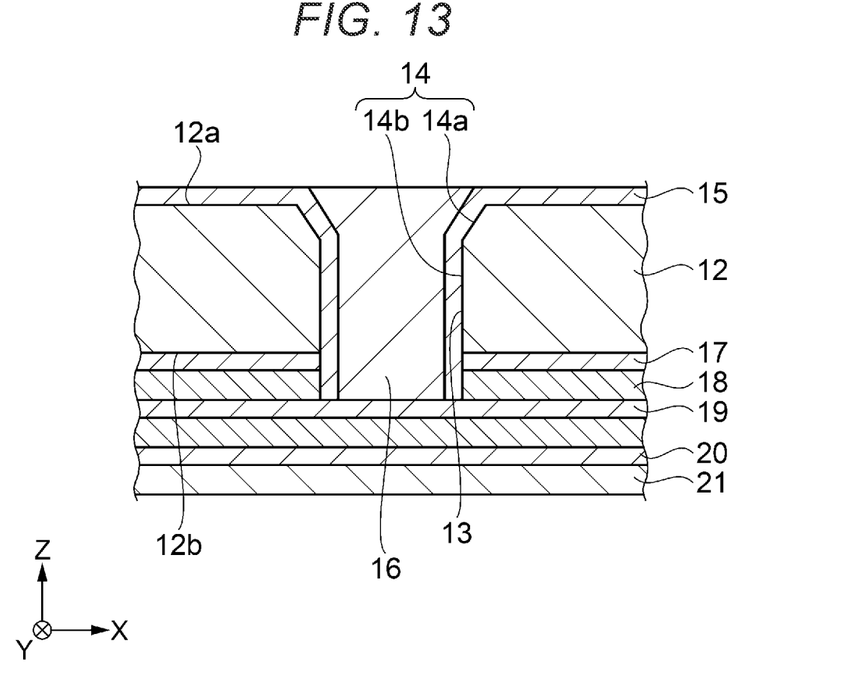
FIG. 13 is a cross sectional view showing the method for manufacturing the circuit board.

In step S105, as shown in FIG. 13, the conductor 16 is formed on the opposite side of the organic insulating from the side surface 14 of the through hole 13 by the sputtering method, a plating method, a paste embedding method, or the like. As a result, the through electrode 6 having a tapered upper portion and a vertical lower portion is completely formed.

1.6 Dicing step

In step S106, the large circuit board 10 on which the through electrodes 6 are formed is diced by a dicing apparatus or the like.

According to the method for manufacturing the circuit board 10 of the embodiment described above, the circuit board 10 including the through electrodes 6 each having the tapered upper portion and the vertical lower portion can be manufactured. Since the upper portion of the through electrode 6 has the tapered shape, when the organic insulating film 15 is formed on the first surface 12a and the side surface 14 of the through hole 13, it is possible to prevent the organic insulating film 15 at a coupling portion between the first surface 12a and the side surface 14 of the through hole 13 from being locally thinned and to prevent the deterioration of the insulating function.

2. Second Embodiment

Next, a resonator device 1a including a circuit board 10a according to a second embodiment will be described with reference to FIGS. 14 to 16.

Figure 14:
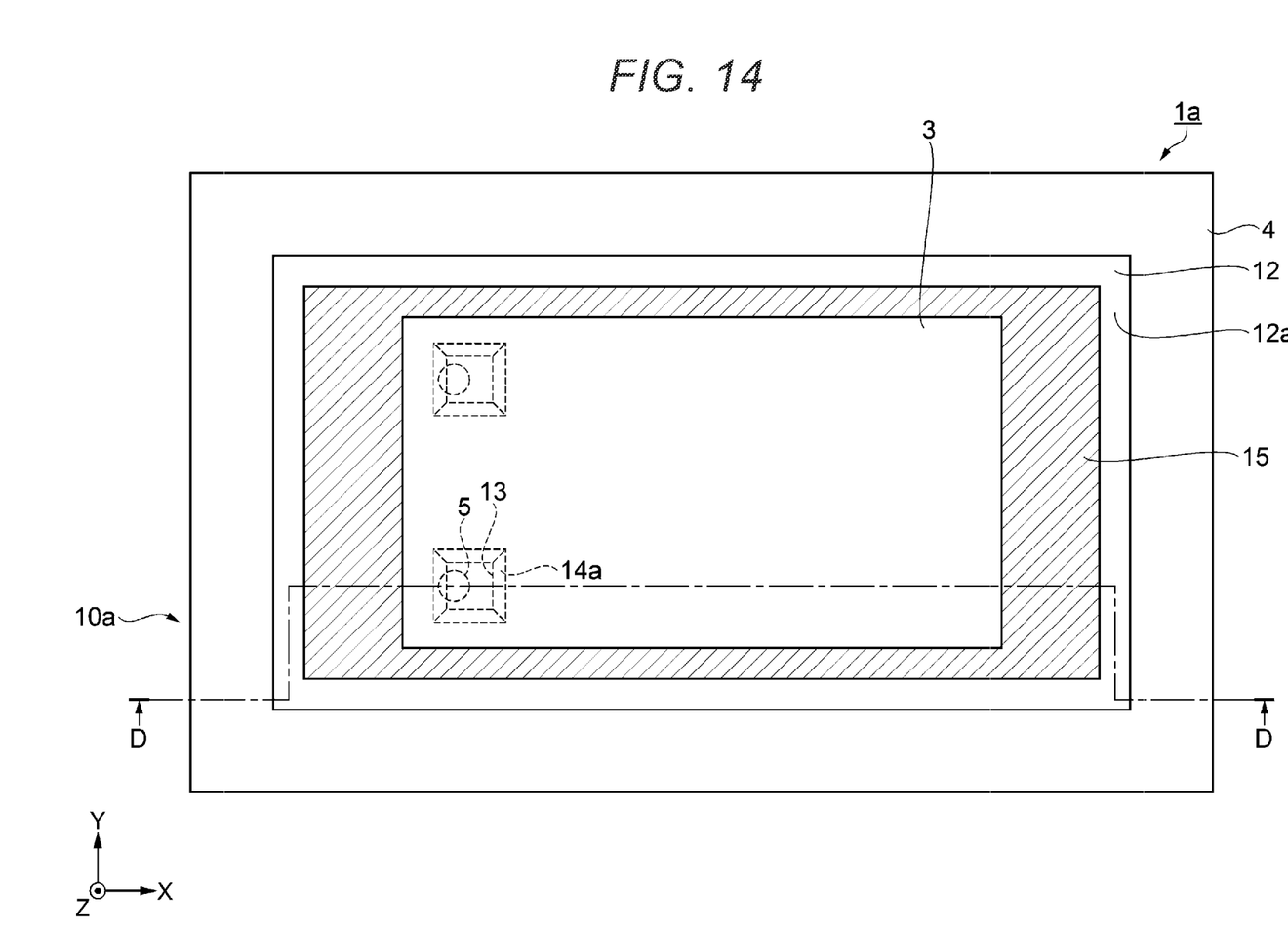
FIG. 14 is a plan view showing a resonator device including a circuit board according to a second embodiment.

FIG. 14 shows a state in which the lid 2 is removed for convenience of description of an internal configuration. In FIGS. 14 and 15, the electrodes provided on the front and back surfaces of the resonator element 3 are not shown.

The circuit board 10a according to the embodiment is similar to the circuit board 10 according to the first embodiment except that the configuration of the insulating film provided on the first surface 12a and the side surface 14 of the through hole 13 is different from that of the circuit board 10 according to the first embodiment. Differences from the first embodiment described above will be mainly described, and the same elements will be denoted by the same reference numerals, and description thereof will be omitted.

Figure 15:
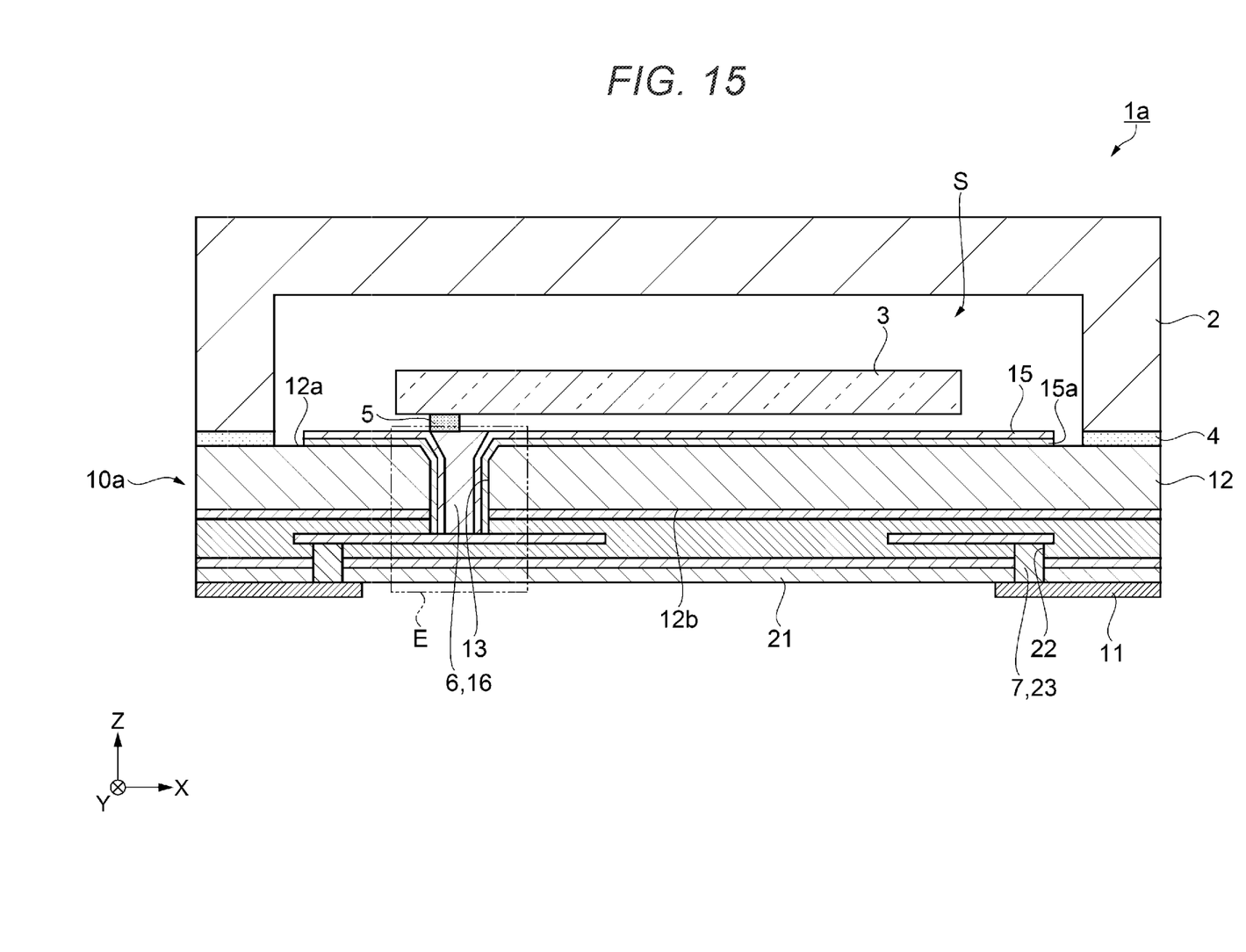
FIG. 15 is a cross-sectional view taken along a line D-D in FIG. 14.

As shown in FIGS. 14 and 15, the resonator device 1a according to the embodiment includes the circuit board 10a, the lid 2 bonded to the circuit board 10a so as to accommodate the resonator element 3 between the lid 2 and the circuit board 10a, and the resonator element 3 disposed on the first surface 12a of the circuit board 10a and electrically coupled to the conductor 16.

Figure 16:
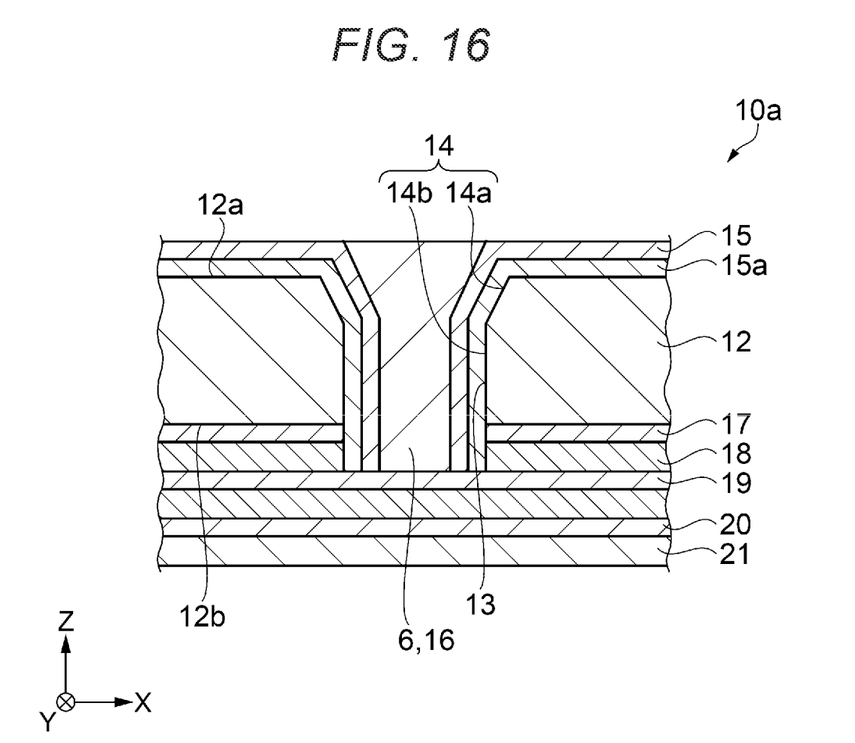
FIG. 16 is an enlarged view of a portion E in FIG. 15.

As shown in FIG. 16, the circuit board 10a includes the semiconductor substrate 12 having the first surface 12a and the second surface 12b located on the opposite side from the first surface 12a, the through hole 13 penetrating the first surface 12a and the second surface 12b, the organic insulating film 15 disposed on the first surface 12a and the side surface 14 of the through hole 13, the conductor 16 disposed on the opposite side of the organic insulating film 15 from the side surface 14 side of the through hole 13, and an inorganic insulating film 15a disposed between the side surface 14 of the through hole 13 and the organic insulating film 15. That is, the inorganic insulating film 15a and the organic insulating film 15 are disposed between the side surface 14 of the through hole 13 and the conductor 16.

According to such a configuration, it is possible to further improve the insulation between the conductor 16 serving as the through electrode 6 and the semiconductor substrate 12, and it is possible to obtain the same effect as that of the circuit board 10 according to the first embodiment.

3. Third Embodiment

Next, a resonator device 1b including a circuit board 10b according to a third embodiment will be described with reference to FIGS. 17 and 18.

Figure 17:
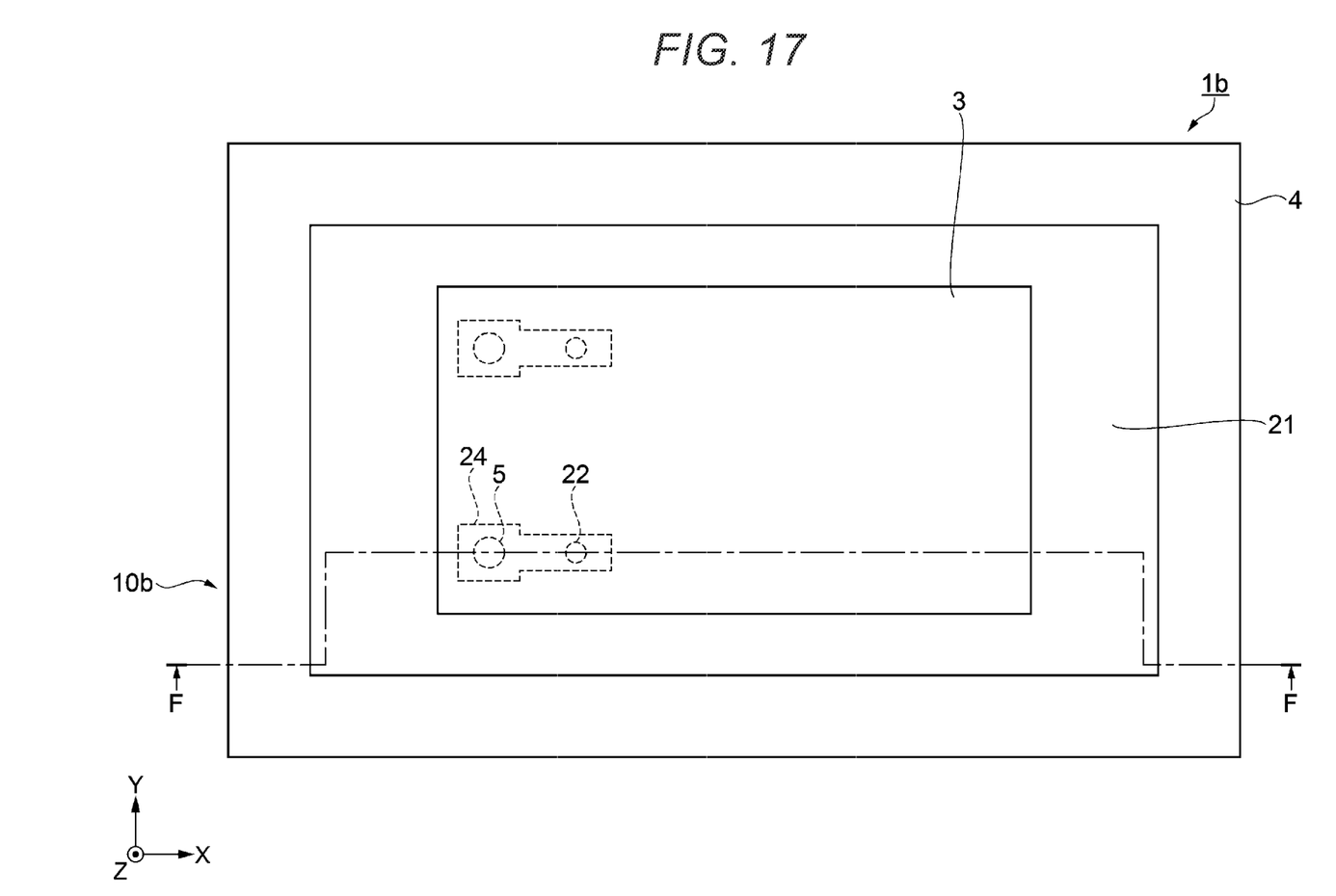
FIG. 17 is a plan view showing a resonator device including a circuit board according to a third embodiment.

FIG. 17 shows a state in which the lid 2 is removed for convenience of description of an internal configuration. In FIGS. 17 and 18, the electrodes provided on the front and back surfaces of the resonator element 3 are not shown.

The circuit board 10b according to the embodiment is similar to the circuit board 10 according to the first embodiment except that the arrangement positions of the through electrodes 6 and 7 are different from those of the circuit board 10 according to the first embodiment, and that the resonator element 3 is mounted on the circuit 21. Differences from the first embodiment described above will be mainly described, and the same elements will be denoted by the same reference numerals, and description thereof will be omitted.

Figure 18:
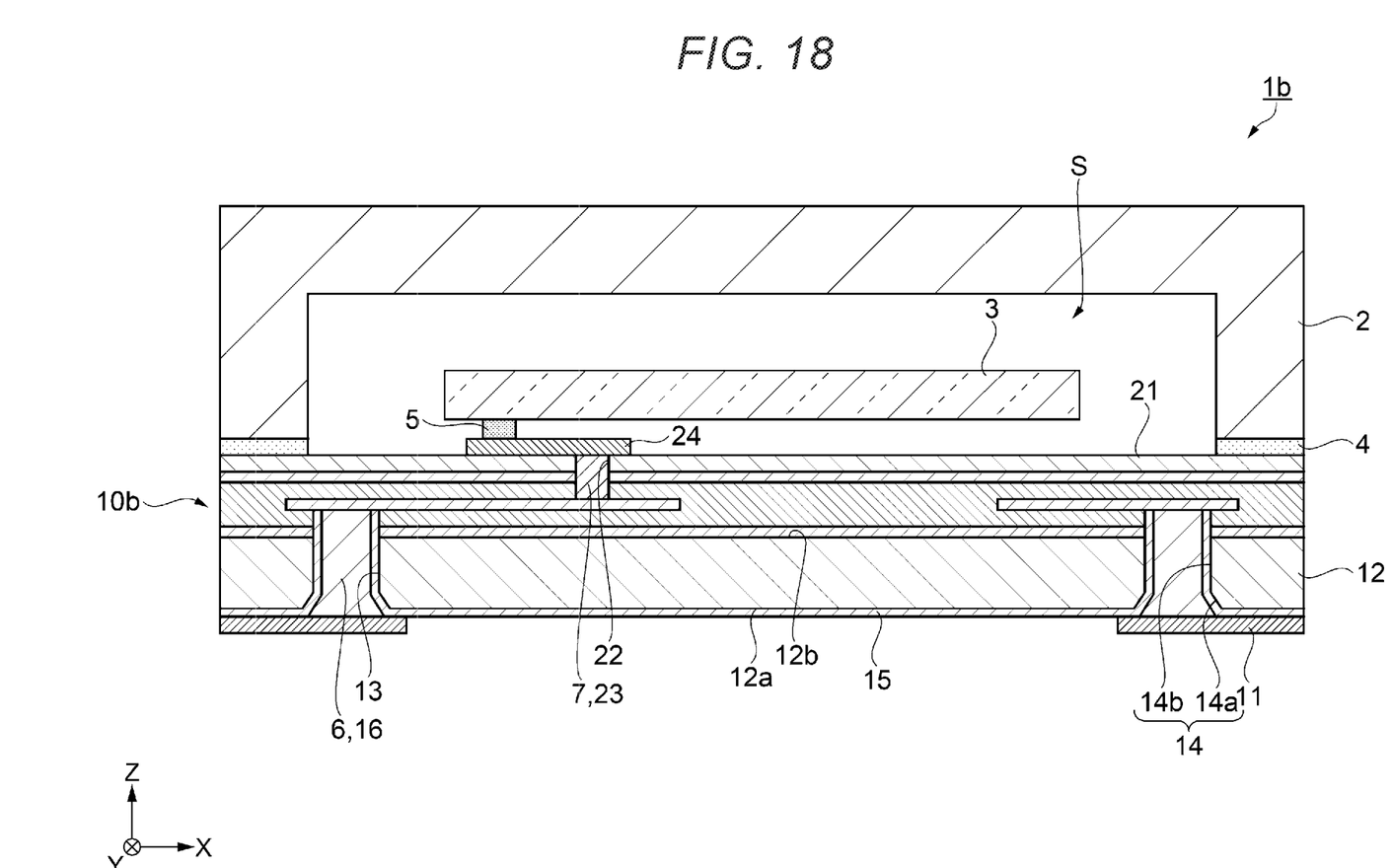
FIG. 18 is a cross-sectional view taken along a line F-F in FIG. 17.

As shown in FIGS. 17 and 18, the resonator device 1b according to the embodiment includes the circuit board 10b, the lid 2 bonded to the circuit board 10b so as to accommodate the resonator element 3 between the lid 2 and the circuit board 10b, and the resonator element 3 disposed on the second surface 12b of the circuit board 10b and electrically coupled to the conductor 23.

The circuit board 10b includes the through electrode 7, which is the conductor 23 provided in the through hole 22 electrically coupled to an internal terminal 24 provided on the circuit 21 on the second surface 12b side of the circuit board 10b, and the through electrode 6, which is the conductor 16 provided in the through hole 13 electrically coupled to the external terminal 11 provided on the organic insulating film 15 on a first surface 12a side of the circuit board 10b. The circuit board 10b further includes the semiconductor substrate 12 having the first surface 12a and the second surface 12b located on the opposite side from the first surface 12a, the through hole 13 penetrating the first surface 12a and the second surface 12b, the organic insulating film 15 disposed on the first surface 12a and the side surface 14 of the through hole 13, and the conductor 16 disposed on the opposite side of the organic insulating film 15 from the side surface 14 side of the through hole 13.

The resonator element 3 is accommodated in the internal space S and the lid 2 is bonded onto the circuit 21 on the second surface 12b side of the circuit board 10b via the bonding member 4.

The resonator element 3 is mechanically and electrically bonded to the internal terminal 24 provided on the second surface 12b side of the circuit board 10b via the bonding member 5 such as a gold bump.

According to such a configuration, it is possible to obtain the same effects as those of the circuit board 10 according to the first embodiment.

What is claimed is:

1. A circuit board comprising:
    a semiconductor substrate having a first surface and a second surface located on an opposite side from the first surface;
    a through hole penetrating the first surface and the second surface;
    an organic insulating film disposed on the first surface and a side surface of the through hole;
    an inorganic insulating film provided between a side surface of the through hole and the organic insulating film; and
    a conductor disposed on an opposite side of the organic insulating film from the side surface side of the through hole, wherein
    the side surface of the through hole has
        a first side surface coupled to the first surface and having a width decreased from the first surface toward the second surface, and
        a second side surface coupled to the second surface from an end portion of the first side surface on a second surface side.

2. The circuit board according to claim 1, wherein the second side surface is a surface perpendicular to the first surface.

3. The circuit board according to claim 1, wherein the semiconductor substrate is a single crystal silicon substrate, and the through hole has a rectangular shape in a plan view.

4. The circuit board according to claim 3, wherein the single crystal silicon substrate is a single crystal silicon (100) substrate.

5. The circuit board according to claim 1, further comprising:
    a circuit electrically coupled to the conductor on the second surface side.

6. A method for manufacturing a circuit board, the circuit board including
    a single crystal silicon substrate having a first surface and a second surface located on an opposite side from the first surface,
    a through hole penetrating the first surface and the second surface,
    an organic insulating film disposed on the first surface and a side surface of the through hole, and
    a conductor disposed on an opposite side of the organic insulating film from a side surface side of the through hole, the method for manufacturing the circuit board comprising:
    a circuit board preparation step of preparing the circuit board including the single crystal silicon substrate;
    a groove forming step of forming, on the first surface by wet etching, a bottomed groove having a rectangular shape in a plan view and having a first side surface having a width decreased toward the second surface;
    a through hole forming step of, after the groove forming step, forming the through hole having a second side surface extending from an end portion of the first side surface on a second surface side toward the second surface and penetrating the first surface and the second surface;
    an organic insulating film forming step of, after the through hole forming step, forming the organic insulating film at the first surface and the first side surface and the second side surface of the through hole; and
    a conductor forming step of forming the conductor on the organic insulating film on an opposite side from the side surface side of the through hole.

7. The method for manufacturing a circuit board according to claim 6, wherein
    in the through hole forming step, the through hole is formed by a metal assisted chemical etching method.

8. The method for manufacturing a circuit board according to claim 6, wherein
    a depth of the first side surface from the first surface is 0.1 μm or more and 3 μm or less.

9. The method for manufacturing a circuit board according to claim 6, wherein
    the single crystal silicon substrate is a single crystal silicon (100) substrate.

10. A resonator device comprising:
    a circuit board comprising:
        a semiconductor substrate having a first surface and a second surface located on an opposite side from the first surface;
        a through hole penetrating the first surface and the second surface;
        an organic insulating film disposed on the first surface and a side surface of the through hole; and
        a conductor disposed on an opposite side of the organic insulating film from a side surface side of the through hole, wherein
        the side surface of the through hole has
            a first side surface coupled to the first surface and having a width decreased from the first surface toward the second surface, and a second side surface coupled to the second surface from an end portion of the first side surface on a second surface side;
a resonator element disposed on the first surface or the second surface of the circuit board and electrically coupled to the conductor; and
a lid bonded to the circuit board so as to accommodate the resonator element between the lid and the circuit board.

* * * * *